(12) United States Patent
Imschweiler et al.

(10) Patent No.: US 6,428,361 B1
(45) Date of Patent: Aug. 6, 2002

(54) SURFACE MOUNTABLE CONNECTOR ASSEMBLY INCLUDING A PRINTED CIRCUIT BOARD

(75) Inventors: Derek Imschweiler; John Hess, both of Dallastown; Ronald Locati, York, all of PA (US)

(73) Assignee: Stewart Connector Systems, Inc., Glen Rock, PA (US)

( * ) Notice: Subject to any disclaimer, the term of this patent is extended or adjusted under 35 U.S.C. 154(b) by 0 days.

(21) Appl. No.: 09/317,249

(22) Filed: May 24, 1999

(51) Int. Cl.[7] ............... H01R 24/00; H01R 33/945; H01R 3/00
(52) U.S. Cl. ............ 439/676; 439/620; 439/490
(58) Field of Search ................... 439/344, 660, 439/667, 668, 676, 620

(56) References Cited

U.S. PATENT DOCUMENTS

| | | | |
|---|---|---|---|
| 4,978,317 A | 12/1990 | Pocrass | 439/490 |
| 5,069,641 A * | 12/1991 | Sakamoto et al. | 439/620 |
| 5,364,294 A * | 11/1994 | Hatch et al. | 439/676 |
| 5,601,451 A | 2/1997 | Driones et al. | 439/490 |
| 5,613,873 A | 3/1997 | Bell, Jr. | 439/490 |
| 5,647,767 A | 7/1997 | Scheer et al. | 439/620 |
| 5,685,737 A | 11/1997 | Morin et al. | 439/490 |
| 5,687,233 A * | 11/1997 | Loudermilk et al. | 379/442 |
| 5,700,157 A | 12/1997 | Chung | 439/490 |
| 5,704,802 A | 1/1998 | Loudermilk | 439/490 |
| 5,736,910 A | 4/1998 | Townsend et al. | 333/181 |
| 5,741,152 A | 4/1998 | Boutros | 439/490 |
| 5,775,946 A | 7/1998 | Briones | 439/607 |
| 5,790,041 A | 8/1998 | Lee | 340/815.45 |
| 5,797,767 A | 8/1998 | Schell | 439/490 |
| 5,989,069 A * | 11/1999 | Tan | 439/620 |

* cited by examiner

Primary Examiner—Khiem Nguyen
Assistant Examiner—Michael C. Zarroli
(74) Attorney, Agent, or Firm—Steinberg & Raskin, P.C.

(57) ABSTRACT

Connector assembly including a jack defining a plug-receiving receptacle and a shield arranged around the jack. The jack includes a printed circuit board component including a printed circuit board, a first set of contacts each including a contact portion arranged in the receptacle and a board portion connected to the printed circuit board, and a second set of contacts each including a terminal portion adapted for mounting to a planar surface of a substrate and a board portion connected to the printed circuit board. The printed circuit board includes a wiring pattern for electrically coupling the first and second sets of contacts. The terminal portions extend rearwardly and downward from the jack and have a co-planar portion. The jack may include an LED arranged proximate the printed circuit board, in which case the jack also includes a light pipe element that can transmit light from the LED to be visible from a front face of the jack, or adjacent the front face of the jack, in which case electrical leads connect the LED to the printed circuit board. The jack can also include electrical signal processing components, such as toroids for filtering applications, which may be mounted on the printed circuit board.

19 Claims, 8 Drawing Sheets

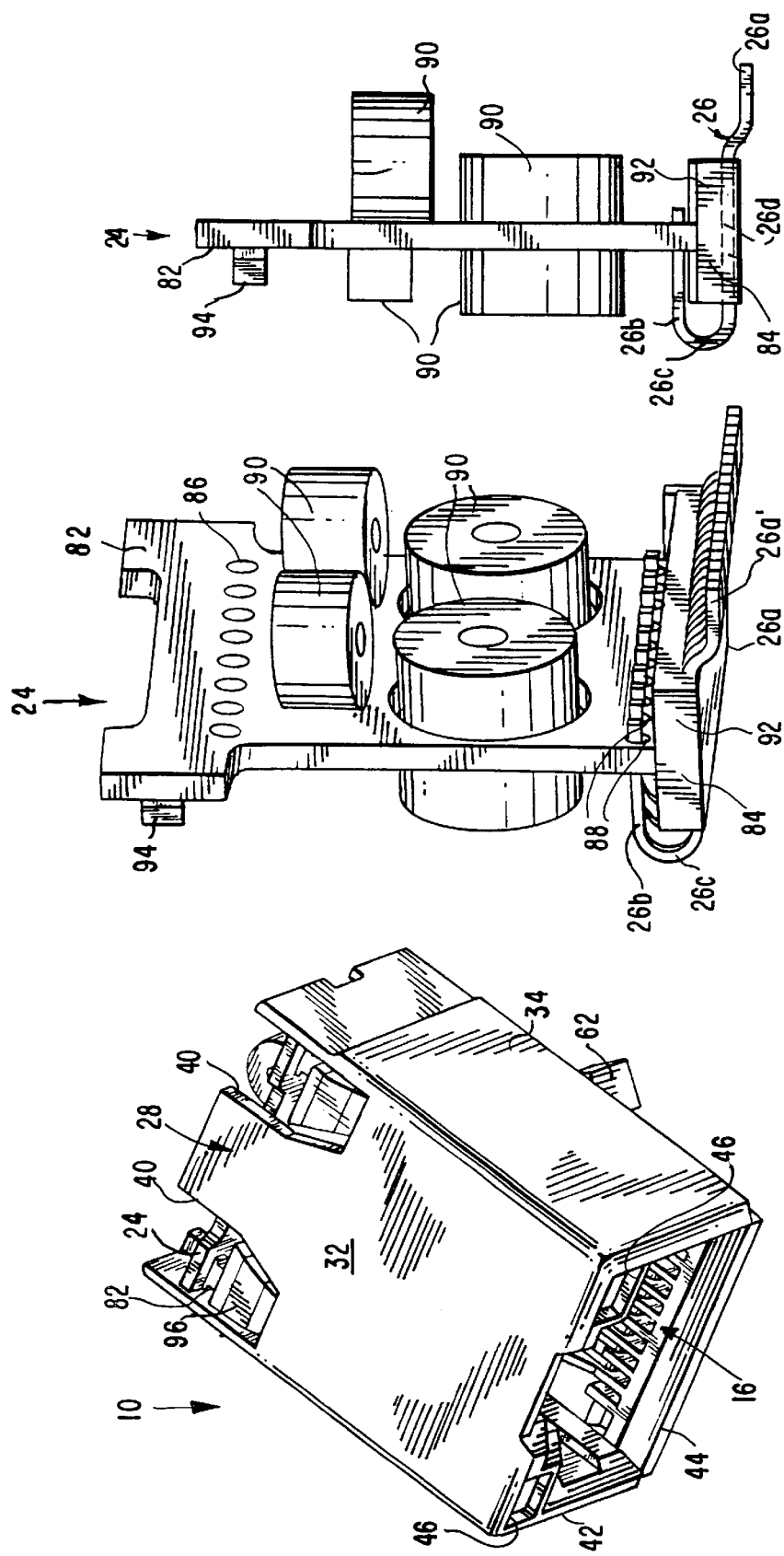

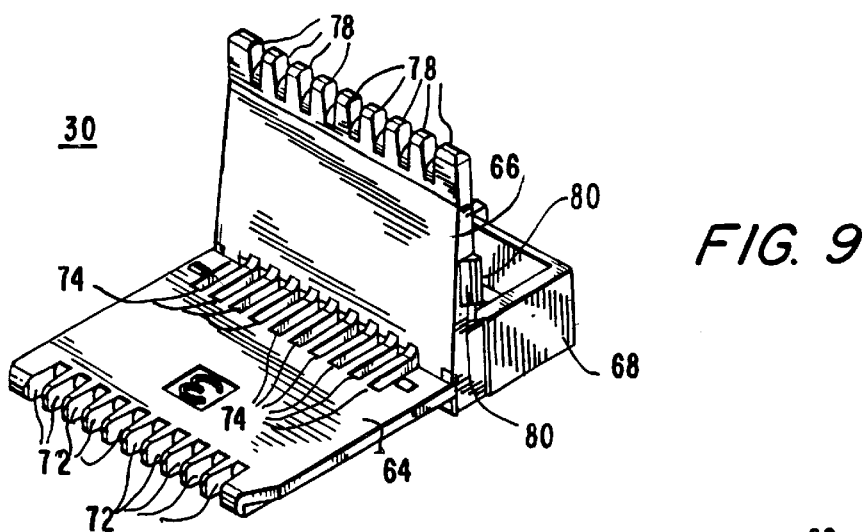
FIG. 9
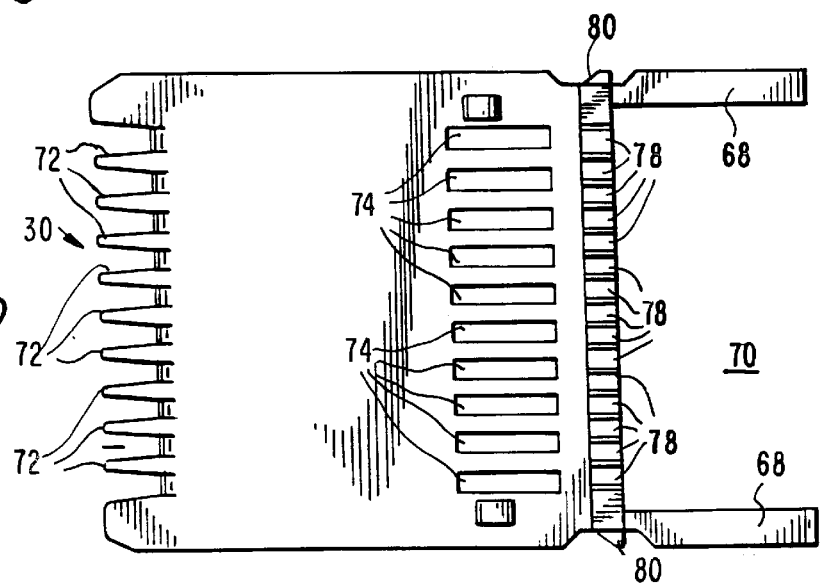
FIG. 10
FIG. 11

SURFACE MOUNTABLE CONNECTOR ASSEMBLY INCLUDING A PRINTED CIRCUIT BOARD

FIELD OF THE INVENTION

The present invention relates generally to surface-mountable modular electrical connector assemblies including a printed circuit board. Electrical signal processing components, such as magnetic components for filtering common mode and differential mode interference and for eliminating high frequency noise, and/or light emitting means for indicating, e.g., electrical coupling with the connector assembly, may be mounted on the printed circuit board.

As used herein, "surface-mountable" means that the connector assemblies are mountable onto a surface of a substrate, such as a printed circuit board, and include terminal pins adapted to engage solder portions on the planar surface of the substrate.

BACKGROUND OF THE INVENTION

Modular jack connectors or connector assemblies are well known in the telecommunications industry and have been adapted for mounting to printed circuit boards. These connector assemblies are typically used for electrical connection between two electrical communication devices. There are basically two ways to mount a connector assembly to a printed circuit board, namely surface mounting in which the terminal pins (or terminal portions of the contacts) engage soldering portions on a planar surface of the substrate and through-hole mounting in which the terminal pins pass through apertures in the printed circuit board.

One recurring problem with surface-mountable connector assemblies has been to achieve co-planarity between the terminal portions of all of the contacts in the connector assembly or all of the terminal pins. The terminal portions or pins are designed to engage solder regions of a planar substrate onto which the connector assembly is mounted. It is important that each of the terminal portions or pads engage the respective solder region in order to ensure proper electrical connection between the contacts and the substrate and because if the terminal portions or pads are situated in different planes, problems may arise during the soldering of the terminal portions or pads to the printed circuit board.

Another general problem with connector assemblies is that they are frequently subject to adverse operation in the presence of radio frequency interference in the electrical lines connecting the devices including such connector assemblies to, e.g., data communication lines. The electrical devices are not only susceptible to such interference, they also function as a source of such interference. Filters must therefore be interposed between connected electrical devices to screen out the interference and minimize its effect on the operation of the electrical devices. This interference may cause two types of distortion of the power circuit wave form, viz., common mode interference where identical wave forms are impressed on the electrical lines connecting the electrical devices, and differential mode interference which appears as a voltage difference between the connecting electrical lines. Circuitry exists to filter radio frequency interference, but for optimum effectiveness and cost, it has been found to be more efficient to treat the two types of interference independently, i.e., to provide one group of electrical components to serve as a common mode filter and another group of electrical components to serve as a differential mode filter.

Since electrical devices are often coupled by modular jack connector assemblies, it is desirable to construct modular jack connector assemblies with integral magnetic filter components to avoid the need for additional, external filter components. One such connector assembly is described in U.S. Pat. No. 5,736,910 (Townsend et al.). Townsend et al. describes a modular jack connector assembly mounted on a main printed circuit board and having a receptacle into which a modular plug of an electronic component is inserted. The connector assembly includes a housing, a first set of contacts arranged in the housing each adapted to engage one of the contacts of the plug, a second set of contacts at least partially arranged in the housing and adapted to engaging the main printed circuit board, contact coupling circuit means for electrically coupling the first and second sets of contacts, a capacitor for providing impedance to high frequency noise and interference and a metallic shield at least partially surrounding the housing and connected to a grounding region on the main printed circuit board. The contact coupling circuit means include the filtering components which is one embodiment are toroidal coil pairs which function separately as either a differential mode filter or a common mode filter. The entire disclosure of Townsend et al. is incorporated by reference herein.

Furthermore, once the connector assemblies are mounted to the substrate, in order to ensure that a proper connection has been made and therefore a link is created between a mating plug and the connector assemblies, indicators are often incorporated into circuits on the substrate, i.e., printed circuit board. These indicators are typically light emitting diodes (LEDs) which are turned on when a circuit is completed between the mating connector assemblies and the communication devices. Additionally, LEDs can be mounted on the printed circuit board to indicate a number of other conditions including the passage of communications signals between the two communication devices, indication of power, or indication that an error in transmitting the signals has occurred. Thus, LEDs provide an easy visual reference for enabling the tester of a circuit card to test the operation of circuits on the card as well as providing a status indicator during normal operation of the card.

In an effort to miniaturize printed circuit boards and increase the available space on the printed circuit board, visual indicators have been integrated into these connector assemblies. An example of such a connector assembly is disclosed in U.S. Pat. No. 4,978,317 to Pocrass which describes a connector assembly for receiving a plug having a visual indicator positioned within the front wall of the electrical connector housing. Incorporation of the indicator into the electrical connector eliminates the need for a separate location on the printed circuit board for mounting of such an indicator. The LED indicator is inserted into a recess of the housing of the electrical connector such that its electrical leads pass through a wall of the housing and connect to the printed circuit board. The indicator is then cemented into the recess or attached to the housing using an appropriate adhesive. The LEDs may also be molded into the electrical connector during the molding process of the housing.

A problem arises with these connector assemblies in that because the anode and cathode leads of the LED are side by side confusion and misconnection can result prior to board mounting. It is desirable to eliminate the need for securing the LEDs in the housing by cementing or attaching with an adhesive.

Another problem arises in that in the LEDs are situated at the front of the connector assembly, in the narrow space between the mating connector opening and the top or bottom and sides of the connector assembly. Since the connector assemblies, typically telephone jack or "RJ"-type connector assemblies, are generally limited to predetermined dimensions, and because these connector assemblies were not initially designed to accommodate lights or other components at the front of the connector assembly, the available space is very small, and thus the LEDs are also limited in size and power. In addition, the placement of the LEDs at the front of the connector assembly presents the problem that the lead wires for the LEDs must be run through the connector assembly and bent at a ninety degree angle in order to reach the circuit board to which they are to be connected, making installation of the lights in the connector assembly difficult.

Another example of a connector assembly including an indicator light is U.S. Pat. No. 5,601,451 to Driones et al. Driones et al. shows a connector assembly having LEDs situated in openings within the stepped portion of a modular jack interior profile (FIGS. 5 and 6). Shoulders are provided to hold the LEDs in place, i.e., they are constructed to enable insertion of the LEDs through the front face of the housing while preventing removal of the LEDs through the bottom surface of the connector assembly.

Further, U.S. Pat. No. 5,613,873 to Bell, Jr. shows a modular jack having a recess in a front face for receiving a light-emitting portion of an LED whereby conductor wires of the LED are passed through passageways in the jack housing to the rear of the housing and then bent downward for connection to a printed circuit board (FIGS. 1–4). In additional embodiments shown in FIGS. 5–12, the LEDs are situated at a rear of the housing and the housing is made of transparent or translucent plastic resin.

U.S. Pat. No. 5,685,737 to Morin et al. shows a modular jack which has LEDs in exteriorly facing recesses in a bottom wall of the housing. The LEDs have guide recesses which cooperate with guide projections situated at the sides of the recesses.

U.S. Pat. No. 5,700,157 to Chung shows a modular jack with LEDs mounted in a recess in the front face whereby each LED is connected via a terminal to a printed circuit board.

U.S. Pat. No. 5,704,802 to Loudermilk shows a modular jack having a two-part housing having a shell and a rear insert and includes three LEDs, each positioned in a chamber at the front of the shell and having conductor leads connected thereto which extend through a lead chamber to the rear of the shell. The conductor leads engage leads of conductors of a lead frame which are situated in the rear insert.

U.S. Pat. No. 5,741,152 to Boutros shows a modular jack having a light guide for conveying light from an LED situated at a rear of the housing.

U.S. Pat. No. 5,775,946 to Briones shows a multi-port connector assembly having LEDs spaced from the printed circuit board to which the connector assembly is mounted and arranged in rearwardly facing cavities in the front wall of the connector assembly (see FIGS. 6 and 8). Leads from the LEDs extend rearwardly and downwardly through recesses for connection to the printed circuit board (See FIG. 6).

U.S. Pat. No. 5,797,767 to Schell shows three embodiments of a modular jack with an indicator light. In a first embodiment shown in FIG. 1, the jack includes a front shield or face plate adapted to be removably or detachably received against a front wall of the jack. The face plate includes brackets having bores through which LEDs are inserted. The brackets correspond in location to cutout areas of the housing of the jack. Leads extend from the LEDs rearwardly and downwardly for connection to a printed circuit board. In a second embodiment shown in FIG. 2, the face plate includes brackets corresponding in location to the cutout areas of the housing of the jack and having one or more notches for providing a seat for LEDs. To this end, the body of the LEDs includes a groove receivable of the notch. Leads extend from the LEDs rearwardly and downwardly for connection to a printed circuit board. In a third embodiment shown in FIGS. 3 and 4, the face plate includes LEDs mounted to the upper portion thereof. The LEDs are electrically coupled to an end of a flexible conductor strip. The conductor strip is contiguous with the top wall of the housing and is electrically coupled to terminal pins that are in turn electrically coupled to circuits on the printed circuit board to which the connector assembly is mounted. A lens overlies the LEDs and softens the LED light effect.

U.S. Pat. No. 5,790,041 to Lee shows a modular jack having an opening situated in a bottom wall defining the plug-receiving cavity and which is positioned above an LED mounted on the printed circuit board to which the jack is mounted (see, e.g., FIG. 3A). Upon insertion of a plug into the cavity in the jack, the LED emits light which passes through the opening and through the transparent part of the plug to provide a visual indication of the status of the connection.

For the most part, in the prior art discussed above, the LEDs are arranged within the housing of the jack. Depending on the particular construction of the jack, the size of the LEDs would be limited in view of the specific dimensional requirements of RJ-type modular jacks. Moreover, since LEDs generate a significant amount of electrical noise, the proximity of the LEDs to the contact members in the jacks could adversely affect the data transmission.

In the prior art discussed above, there is no surface-mountable electrical connector assembly including a printed circuit board in which the terminal portions or pads are reliably positioned co-planar with one another and which is capable of having both a visual indicator and magnetic filtering components mounted on the printed circuit board.

OBJECTS OF THE INVENTION

Accordingly, it is an object of the present invention to provide new and improved surface-mountable modular connector assemblies including a printed circuit board arranged in the housing of the connector assembly.

Another object of the present invention is to provide new and improved surface-mountable modular connector assemblies which solve the problems associated with achieving co-planarity of terminal portions of contacts or terminal pads.

Yet another object of the present invention is to provide new and improved modular connector assemblies including a printed circuit board capable of having visual indicators and/or magnetic filtering components mounted thereon.

SUMMARY OF THE INVENTION

In order to achieve the objects mentioned above and others, one embodiment of a connector assembly for surface-mounting on a substrate comprises a jack defining a plug-receiving receptacle and comprising a printed circuit board component including a printed circuit board, a first set of contacts each including a contact portion arranged in the receptacle and a board portion connected to the printed circuit board, and a second set of contacts each including a terminal portion adapted for mounting to a planar surface of a substrate and a board portion connected to the printed circuit board. The printed circuit board includes a wiring pattern for electrically coupling the first and second sets of contacts. The terminal portions extend rearwardly and downward from the jack and have a co-planar portion which is attached to the planar surface of the printed circuit board, e.g., by soldering.

The jack comprises an outer housing part and an inner housing part arranged in the outer housing part. The inner housing part is generally L-shaped including a front, horizontal portion, a vertical wall extending from a rear edge of and perpendicular to the front portion, and a pair of opposed projections extending rearward at lateral sides of the vertical wall and defining an open space therebetween. The printed circuit board component is situated at least partially in the space between the projections and alongside the vertical wall. The printed circuit board optionally includes at least one electronic signal processing component whereby the wiring pattern thus includes wiring to and/or from the component(s). For example, the signal processing component may be several toroids arranged to provide filtering for the signals being transmitted through the jack.

The printed circuit board component preferably comprises an insert assembly connected thereto and which includes a housing, the second set of contacts being arranged in connection with the housing whereby the co-planar portions of the terminal portions are co-planar with one another prior to connection of the insert assembly to the printed circuit board. An advantage of this construction is that the insert assembly is a separate component. The terminal portion of the contacts in the second set of contacts are adapted to be surface-mounted to the substrate and thus, by manufacturing the insert assembly separately, it can be assured that the terminal portions are co-planar at a rear thereof thereby avoiding problems when mounting the connector assembly to the substrate.

Some embodiments of the connector assembly include light generating means for providing light visible from a front of the jack, e.g., indicative of some function involving the jack. For example, the light generating means, e.g., one or more LEDs, may be arranged proximate and even on the printed circuit board and a light pipe element having at least one light transmitting section arranged in channels in the outer housing part. Each light transmitting section is visible from the front of the jack and situated in a path of the light generating means such that light generated by the light generating means is transmitted through the light transmitting section to the front of the jack. In the alternative, the LEDs may be arranged adjacent and flush with a front face of the jack, in which case, electrical leads are provided and extend from each LED to the printed circuit board. The wiring pattern in the printed circuit board thus provides at least a portion of an electrical path between each LED and at least one contacts in the second set of contacts.

Another embodiment of the connector assembly comprises a jack defining a plug-receiving receptacle and comprising a printed circuit board component including a printed circuit board, a first set of contacts each including a contact portion arranged in the receptacle and a board portion connected to the printed circuit board, a second set of contacts each including a terminal portion adapted for connection to a substrate on which the connector assembly is mounted and a board portion connected to the printed circuit board, and light generating means arranged in connection with the printed circuit board for providing light visible from a front of the jack. The printed circuit board includes a wiring pattern for electrically coupling the first set of contacts, the second set of contacts and the light generating means. For this embodiment, the terminal portions may be adapted for surface mounting or through-hole mounting to the substrate.

DESCRIPTION OF THE DRAWINGS

A more complete appreciation of the present invention and many of the attendant advantages thereof will be readily understood by reference to the following detailed description when considered in connection with the accompanying drawings in which:

FIG. 4 is a perspective view of the jack of the connector assembly shown in FIG. 1;

FIG. 9 is a perspective view of an inner housing part of the jack shown in FIG. 4;

FIG. 10 is a top view of the inner housing part shown in FIG. 9;

FIG. 11 is a bottom view of the inner housing part shown in FIG. 9;

FIG. 12 is a perspective view of a filtering unit of the jack shown in FIG. 4;

FIG. 13 is a side view of the filtering unit shown in FIG. 12;

DETAILED DESCRIPTION OF THE PREFERRED EMBODIMENTS

Figure 1:
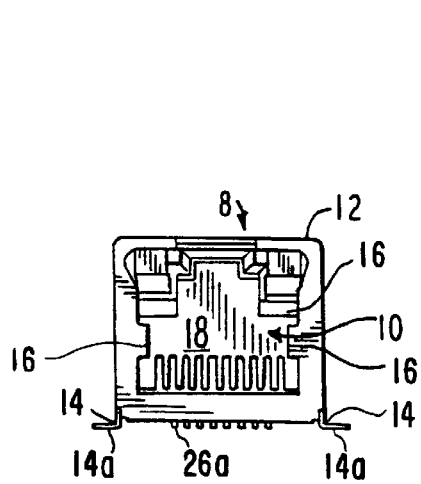
FIG. 1 is a front view of a surface-mountable connector assembly in accordance with the invention.
Figure 2:
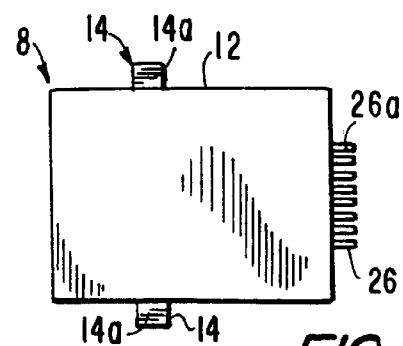
FIG. 2 is a top view of the connector assembly of FIG. 1.
Figure 3:
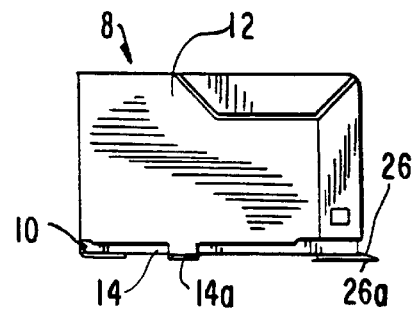
FIG. 3 is a side view of the connector assembly of FIG. 1.

Referring to the accompanying drawings wherein the same reference numerals will be used to designate identical or similar elements throughout the several views, FIGS. 1–3 show a surface-mountable connector assembly 8 in accordance with the invention including a surface mountable jack 10 and a shield 12. To facilitate surface mounting of the connector assembly 8 to the printed circuit board and establish electrical grounding connection between the shield 12 and the ground of the printed circuit board, each lower side edge of the shield 12 includes an outwardly projecting L-shaped tab 14 having a flat portion 14a adapted to be coupled to a grounding region of the printed circuit board. The flat portions 14a may be arranged in-line, i.e., at the same distance rearward of the front face of the connector assembly 8 as shown, or offset from one another, i.e., at different distances rearward of the front face of the connector assembly 8. Shield 12 includes tabs 16 extending from the front face of the shield 12 inward into a plug-receiving receptacle 18 of the jack 10 and may also include other grounding tabs as known and used in the art.

As shown in greater detail in FIG. 4, jack 10 includes a housing 20 defining the plug-receiving receptacle 18, a first set of contacts 22 (also referred to herein as contact members) arranged in the housing 20, a printed circuit board component 24 and a second set of contacts 26 (also referred to herein as terminal members). Each contact member 22 has a contact portion 22a situated in the receptacle 18 (see FIG. 1). Each terminal member 26 includes a first terminal portion 26a extending rearward from the rear face of the jack 10 and slightly below the lower face of the jack 10 (see FIG. 3). The first terminal portions 26a are adapted to be coupled to mating pads on the planar surface of a substrate to which the connector assembly is mounted such as a printed circuit board. Printed circuit board component 24 is described in detail below.

In the illustrated embodiment, the jack 10 is of the RJ-45 type in that it includes eight contact members 22. However, the housing 20 is designed to accommodate up to ten contact members 22. Housing 20 may be designed to accommodate any number of contact members without deviating from the spirit and scope of the invention.

Figure 5:
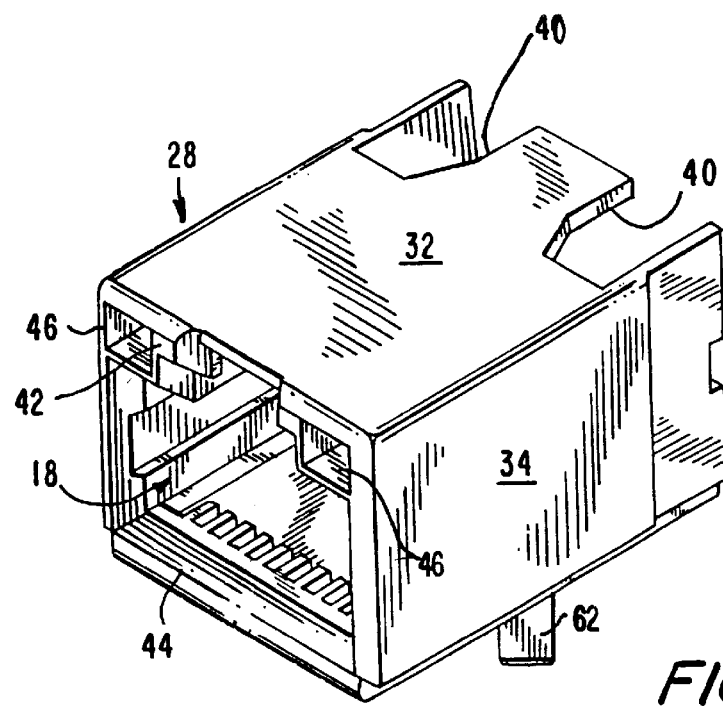
FIG. 5 is a front perspective view of an outer housing part of the jack shown in FIG. 4.
Figure 6:
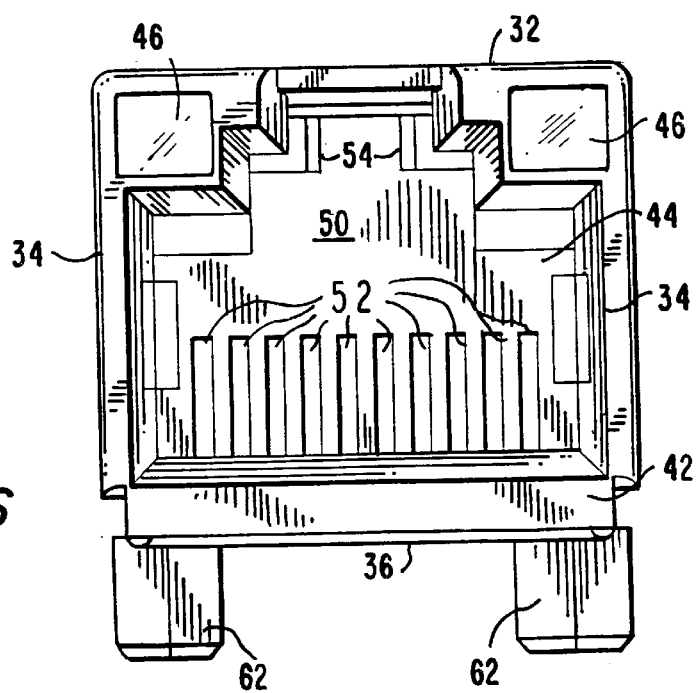
FIG. 6 is a front view of the outer housing part of FIG. 5.
Figure 7:
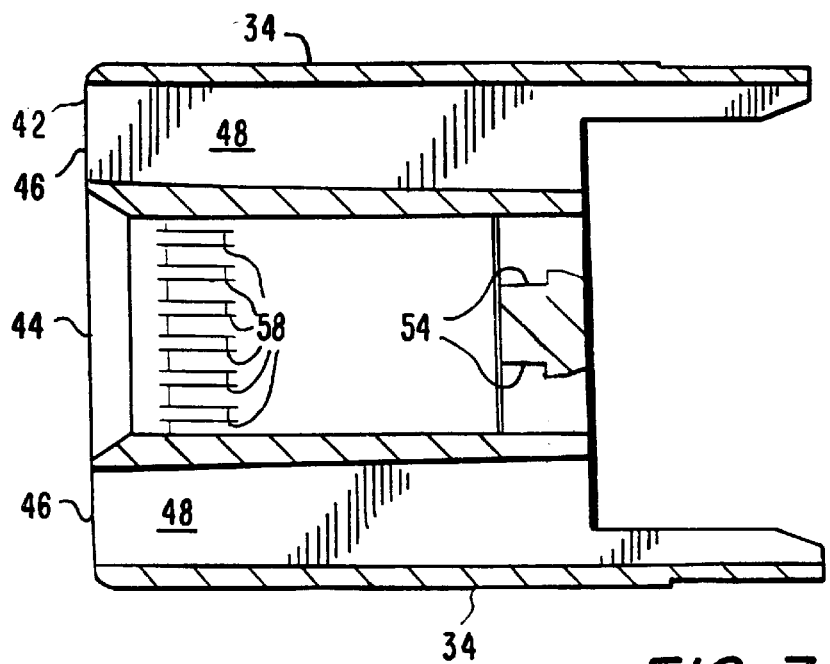
FIG. 7 is a cross-sectional view of the outer housing part of FIG. 5 taken along the line 7— 7 of FIG. 6.
Figure 8:
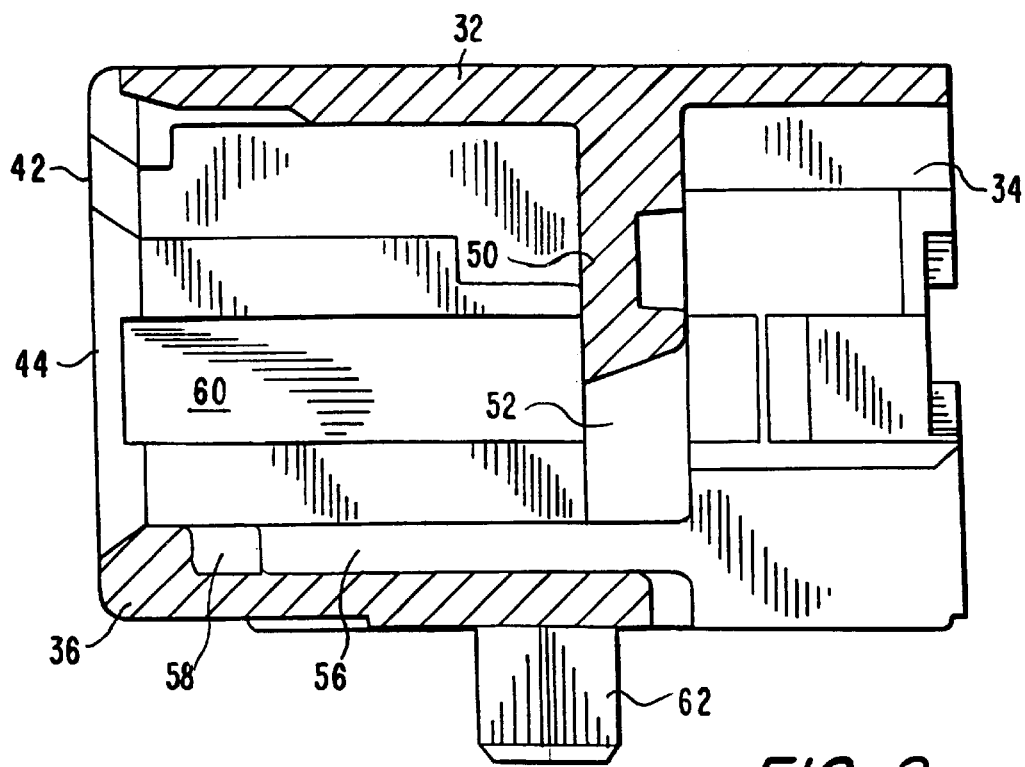
FIG. 8 is a cross-sectional view of the outer housing part of FIG. 5 taken along the line 8—8 of FIG. 6.

Housing 20 includes an outer housing part 28, shown in detail in FIGS. 5–8, and an inner housing part 30, shown in detail in FIGS. 9–11, both made of dielectrical material. As shown in FIGS. 5–8, the outer housing part 28 includes a top wall 32, side walls 34 and a bottom wall 36. A portion of the top wall 32 and side walls 34 extend beyond a rear edge of the bottom wall 36 to thereby define a cavity 38 at the rear of the outer housing part 28 into which the inner housing part 30 is inserted (FIG. 7). The top wall 32 is shaped to define recesses 40 at a rear thereof, the purpose of which is explained below (FIG. 5). The front face 42 of the outer housing part 28 includes a plug aperture 44 and apertures 46 in each stepped portion. Outer housing part 28 also includes a pair of elongate channels 48 extending from the apertures 46 in the front face 42 rearward to the cavity 28 (FIG. 7). Outer housing part 28 also includes a comb portion 50 defining a plurality of slots 52 for receiving ends of the contact members 22. A pair of apertures 54 are situated in the comb portion 50 above the slots 52, the purpose of the apertures 54 is explained below with reference to FIG. 14. A slot 56 is formed along the bottom wall 36 and ten tongues 58 extend from a forward end of slot 56 therein (FIG. 8). The purpose of slot 56 and tongues 58 is explained below. The interior walls 60 at a front portion of the outer housing part 28 forward of the comb portion 50 define the receptacle 18. Outer housing part 28 may include mounting posts 62 extending outward from the bottom wall 36 for facilitating connection of the connector assembly 8 to the printed circuit board, i.e., mounting posts 62 when present are adapted to be inserted into corresponding apertures in the printed circuit board. Top wall 32 includes complementary surfaces adapted to receive and retain the latch of a mating plug (see FIG. 8).

Referring now to FIGS. 9–11, inner housing part 30 is generally L-shaped including a front, horizontal portion 64 and a vertical wall 66 extending from a rear edge of and perpendicular to the front portion 64, and also includes a pair of opposed projections 68 extending rearward at the sides of the vertical wall 66 and defining an open space 70 therebetween. Front portion 64 is dimensioned to slide within the slot 56 along the bottom wall 36 of the outer housing part 28.

Eight guide channels 72 are formed in the front edge of front portion 64 and eight slots 74 are formed at the rear of front portion 64 adjacent the vertical wall 66. Also, eight guide channels 76 are formed on a lower surface of front portion 64, each extending between one of the channels 72 and a respective one of the slots 74 (FIG. 11). Channels 72, slots 74 and channels 76 are dimensioned to accommodate a contact member 22. As shown in FIG. 10, eight guide channels 78 are also formed at the upper edge of vertical wall 66 and are also dimensioned to accommodate a contact member 22. Ridges 80 are formed on the side surfaces of vertical wall 66 to facilitate securing of the inner housing part 30 to the outer housing part 28.

Referring now to FIGS. 12 and 13, printed circuit board component 24 includes a printed circuit board 82 and an insert assembly 84. Printed circuit board 82 includes a first row of through holes or vias 86 at an upper region for receiving terminal portions 22b of the contact members 22 and a second row of through holes or vias 88 at a lower region for receiving second terminal portions 26b of the terminal members 26. The printed circuit board 82 includes wiring for electrically coupling the through holes 86 and through holes 88 such that the contact members 22 are electrically coupled to the terminal members 26 through the wiring of the printed circuit board 82. The wiring pattern may be such that each through hole 86 is not necessarily electrically coupled to a respective one of the through holes 88. Thus, the number of through holes 86 may be different than the number of through holes 88. Indeed, in the illustrated embodiment, there are eight through holes 86 corresponding to the number of contact members 22 and ten through holes 88 corresponding to the number of terminal members 26, the reason for the additional two through holes, i.e., the need for the additional terminal members 26, is explained below.

In addition to a basic wiring pattern for connecting the through holes 86,88, printed circuit board 82 may also have electrical components mounted thereon for processing signals and a wiring pattern for connecting the through holes 86,88 in a circuit with the same, i.e., for electrically interposing electrical components between the contact members 22 and the terminal members 26. In the non-limiting illustrated embodiment, the signal processing components are designed to provide filtering of the signals being transmitted via the contact members 22 and are mounted on the printed circuit board 82. More specifically, as shown in FIGS. 12 and 13, the components include four toroids 90 whereby the wiring pattern of the printed circuit board 82 electrically couples the through holes 86 to through holes 88 via the toroids 90. The benefits of toroids and a wiring pattern of a printed circuit board including the same are disclosed in the Townsend et al. patent referenced above and incorporated herein by reference.

Insert assembly 84 comprises a dielectric housing 92 and the terminal members 26 which may be, e.g., insert-molded into housing 92. Housing 92 is attached to the printed circuit board 82 in any known manner, e.g., adhesive or soldering. Terminal members 26 are formed and arranged in connection with housing 92 in a specific manner so as to provide one of the advantages of the invention, i.e., the co-planarity of at least part of the first terminal portions 26a. To this end, terminal members 26 each include the first terminal portion 26a extending rearwardly from the housing 92 whereby a rear part 26a' of each first terminal portion 26a, which is adapted to engage a soldering pad on the printed circuit board to which the connector assembly 8 is to be attached, is straight and the rear parts 26a' of the first terminal portions 26a are co-planar (in a plane extending transversely to the longitudinal direction of the jack 10). A substantially straight, second terminal or board portion 26b of each terminal member 26 is inserted through a respective through hole 88 in the printed circuit board 82 and electrically connected thereto, e.g., by soldering (FIG. 13). The particular shape of the terminal members 26, i.e., a straight portion 26b, a U-bend 26c adjacent the straight portion 26b, another straight portion 26d passing through the housing 92 and the terminal portion 26a, is designed to ensure that the terminal portions 26a have the required properties to enable soldering to a printed circuit board. Nevertheless, the particular shape is not the only possible shape and other shapes of the terminal members 26 could also be utilized in accordance with the invention.

For this embodiment, it is an advantage that the insert assembly 84 may be manufactured separate from the printed circuit board 82 and secured thereto after manufacturing. In view of such separate manufacture of the insert assembly 84 including the terminal members 26, problems arising from attaining co-planarity of terminal portions of contacts of surface mountable jacks which are only inserted into a jack housing during fabrication of the jack are substantially avoided. Instead, in the invention, the insert assembly 84 could be manufactured in a manner to ensure co-planarity of the rear parts 26a' of the terminal portions 26a. Any insert assembly 84 which does not have co-planar rear parts 26a' of the terminal portions 26 would not be used.

Referring again to FIG. 13, a pair of LEDs 94 are mounted adjacent the front face of the printed circuit board 82. Power and ground leads for the LEDs 94 are formed on the printed circuit board 82. Thus, of the ten terminal members 26, two are electrically connected to a respective power lead of LEDs 94 and one, ground, is electrically connected to both ground leads of the LEDs 94. Of course, the number of terminal members 26 and thus through holes 88 may be less depending on the particular wiring pattern in the printed circuit board 82.

Figure 14:
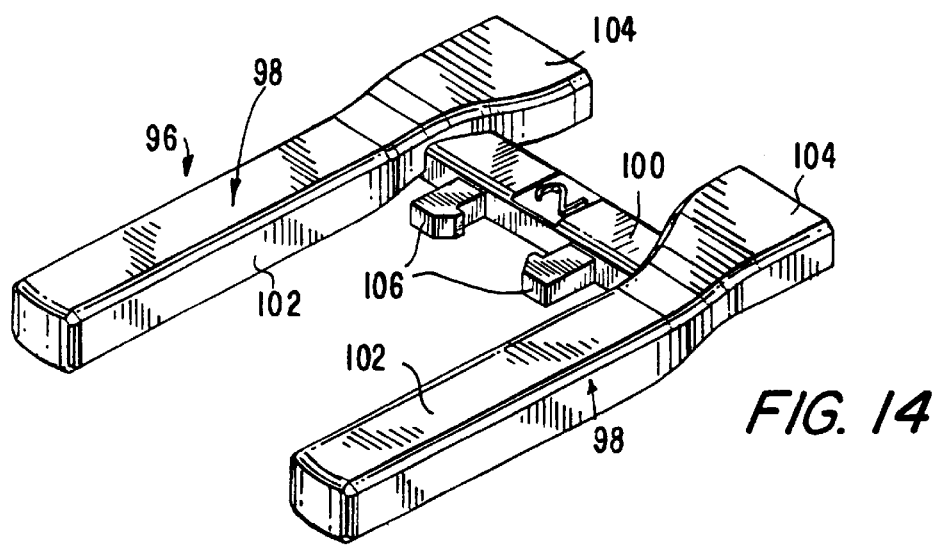
FIG. 14 is a perspective view of a light pipe element of the connector assembly shown in FIG. 1.

Referring now to FIG. 14, in view of the mounting of the LEDs 94 proximate the front face of the printed circuit board 82, the jack 10 includes light transmitting means for transmitting the light from the LEDs 94 to the front face of the jack 10, i.e., a light pipe element 96. The light pipe element 96 is a unitary piece of light transmitting material, such as plastic or glass, having a pair of elongate light transmitting sections 98 and a supporting structure 100 for connecting and supporting the same. Each light transmitting section 98 has an elongate front portion 102 dimensioned to fit within a respective channel 48 in the outer housing part 28 so that the front edge 98' of each light transmitting section 98 is slightly recessed from the front face 42 of the outer housing part 28. A rear portion 104 of the light transmitting sections 98 extends slight upward into the cavities 38 at the rear of the outer housing part 28 and have a larger cross-section that the front portion 102 (although they may have the same cross-section or a smaller cross-section in which case, the cavities 38 might not have to be formed in the top wall 32). The supporting structure 100 includes latches 106 for cooperating with the apertures 54 above the comb portion 50 of the outer housing part 28 to secure the light pipe element 96 to the outer housing part 28. The overall length of the light pipe element 96 is less than the length of the top and side walls 32,34 of the outer housing part 28 such that the rear edge of the light transmitting sections 98 will be inward of the rear edge of the outer housing part 28. Although shown as a unitary piece of light transmitting material, it is possible to construct the light pipe element 96 from multiple components and/or from different materials so long as the light transmitting sections 98 are capable of transmitting light from one end to the other.

Figure 17:
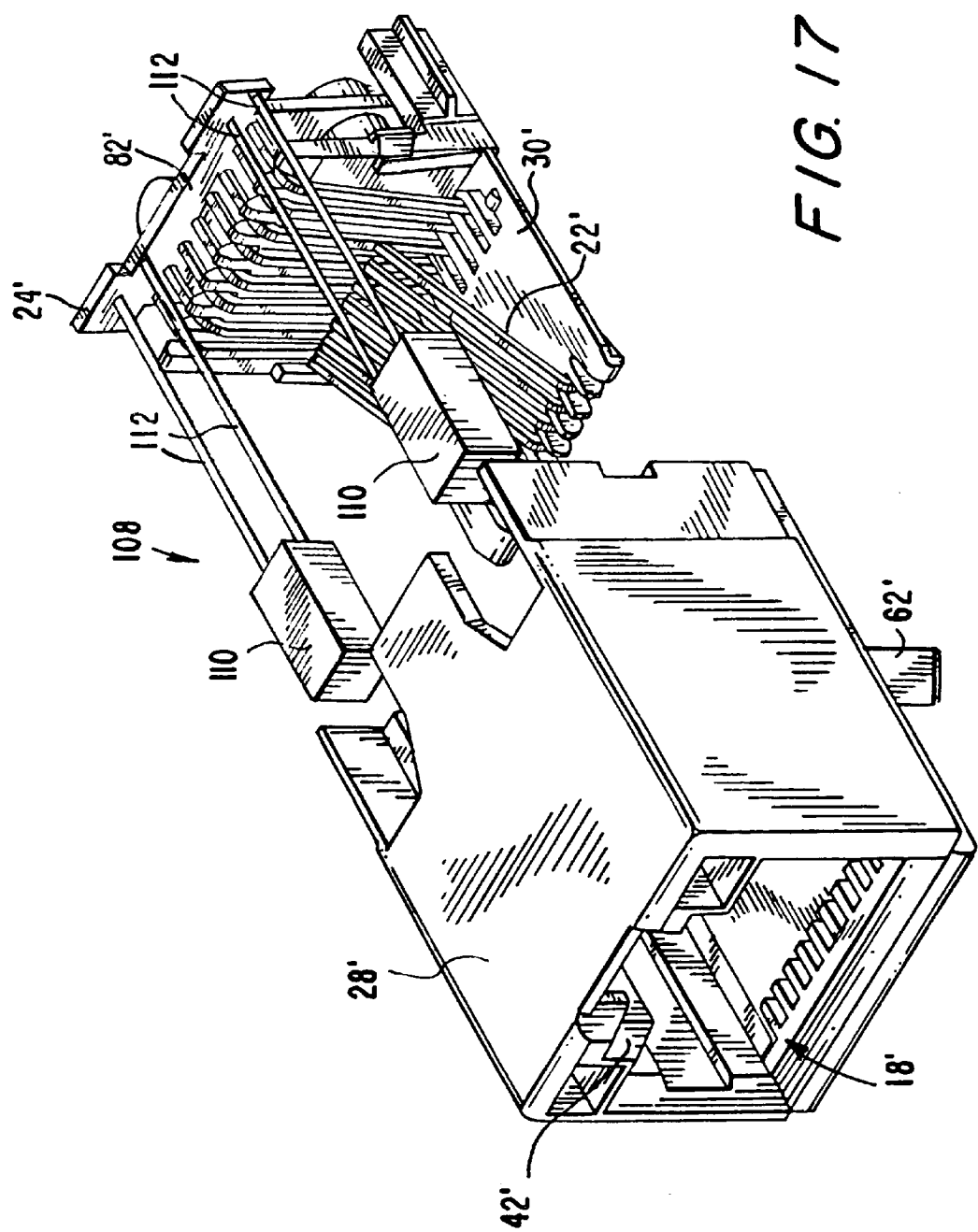
FIG. 17 is an exploded view of another embodiment of jack of a connector assembly in accordance with the invention.

Instead of mounting LEDs proximate the front face of the printed circuit board 82 and providing a light pipe element 96 to enhance the transmission of the light generated by the LEDs from the printed circuit board 82 forward to the front of the jack 10, it is possible to position the LEDs proximate the front face of the jack 10 and connect the LEDs to the printed circuit board 82 by means of electrical leads. This embodiment is shown in FIG. 17 and discussed below.

Figure 15:
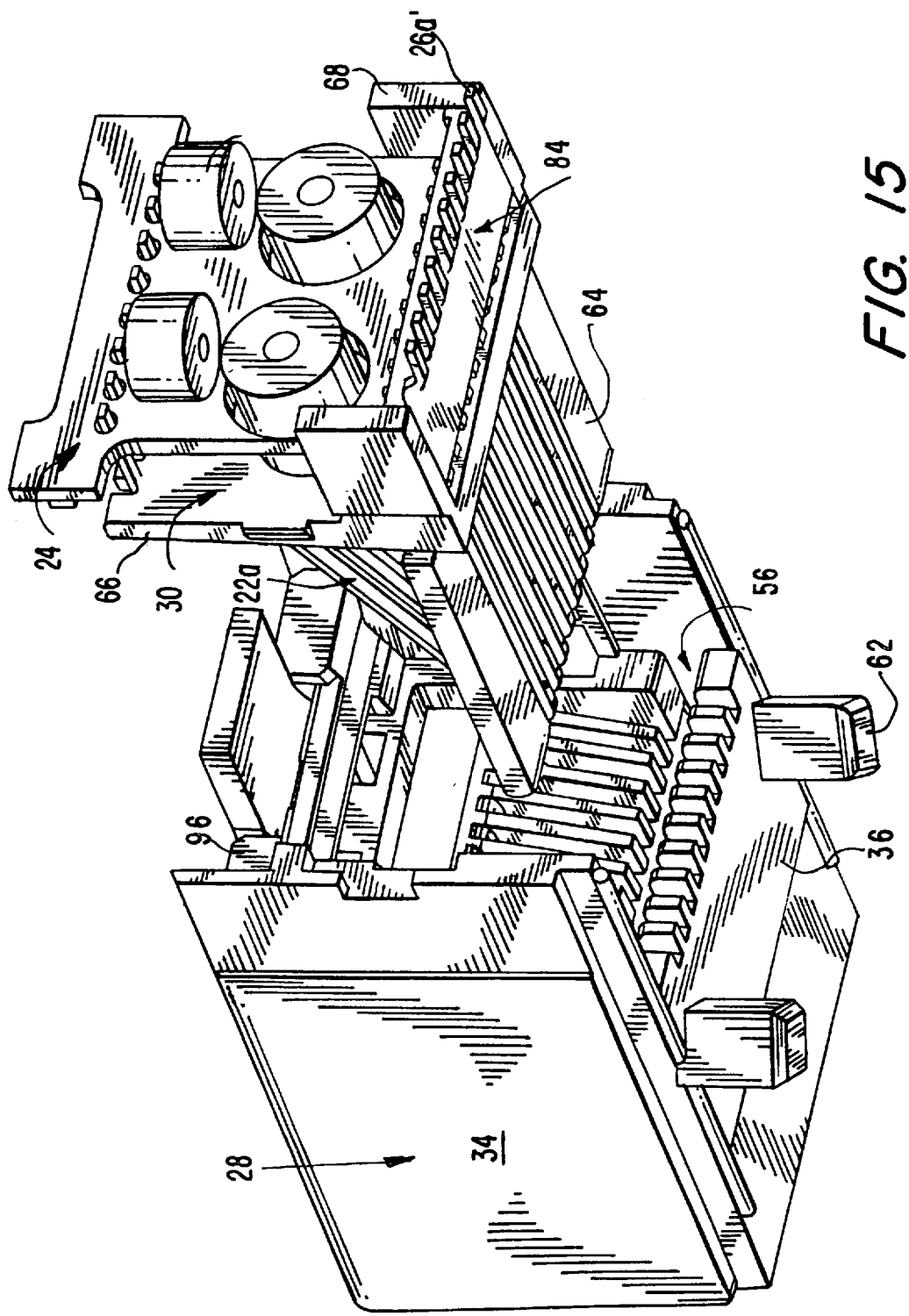
FIG. 15 is an exploded rear perspective view of the jack shown in FIG. 4.
Figure 16:
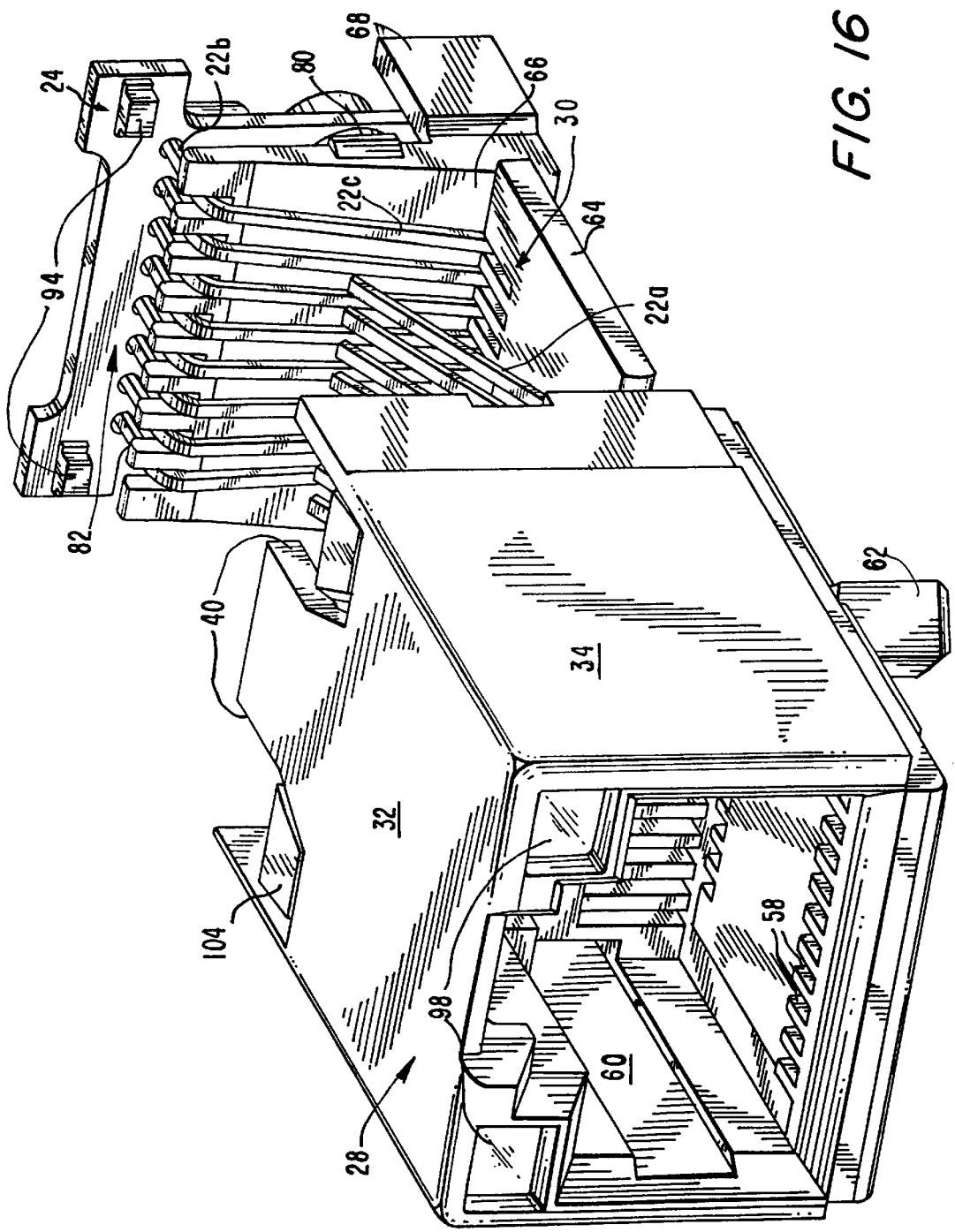
FIG. 16 is an exploded front perspective view of the jack shown in FIG. 4.

To assemble the connector assembly 8, first the jack 10 is assembled. To this end, with reference to FIGS. 15 and 16, the inner housing part 30 and substantially U-shaped contact members 22 are formed and the contact members 22 are inserted into the inner housing part 30. The contact members 22 are bent to form the contact portion 22a, an intermediate portion 22c and a board portion 22b and to pass through channels 72, slots 74 and channels 76. The board portion 22b is inserted into a respective guide channel 78 at the upper edge of the vertical wall 66. The printed circuit board 82 is constructed separately with the optional toroids 90 and LEDs 94 mounted thereon and an appropriate wiring pattern. Terminal members 26 are formed and insert assembly 84 is formed by, e.g., insert molding housing 92 around terminal members 26. The insert assembly 84 and printed circuit board 82 are attached to one another and the board portion 26b of each terminal member 26 is passed through a respective through hole 88 and soldered to the printed circuit board 82. The subassembly of the printed circuit board 82 and insert assembly 84, i.e., the printed circuit board component 24, is then inserted into the space 70 between the projections 68 on the inner housing part 30 such that the board portion 22b of each contact member 22 passes through a respective through hole 86 at the upper region of the printed circuit board 82. The board portions 22b of the contact members 22 are then soldered to the printed circuit board 82 to form a subassembly as shown in FIGS. 15 and 16. In this subassembly, the inner housing part 30 and printed circuit board 82 are secured to one another, e.g., via the contact members 18. The printed circuit board 82 is dimensioned so that the LEDs 94 will be situated above the vertical wall 66 (see FIG. 16).

Separately, the outer housing part 28 and light pipe element 96 are fabricated and the light pipe element 96 is inserted into the outer housing part 28 by inserting latches 106 into apertures 54 (FIG. 15). The subassembly of the inner housing part 30, printed circuit board component 24 and contact members 22 is then inserted into the outer housing part 28 by sliding the front portion 64 of the inner housing part 30 into the slot 56 along the bottom wall 36 of the outer housing part 28. The contact portions 22a of the contact members 22 will pass into and at least partially through the slots 52 in the comb portion 50 of the outer housing part 28 and correct positioning of the inner housing part 30 in slot 56 is aided by the presence of tongues 58. Also, the LEDs 94 will align with the light transmitting sections 98 of the light pipe element 96. Assembly of the jack 10 is not complete.

To assemble the connector assembly 8, a shield 12 is placed over the jack 10. The connector assembly 8 is thus ready to be surface mounted to a printed circuit board. Shield 12 may be secured over jack 10 by any conventional means. Shield 12 is an optional feature of the connector assembly 8 and the connector assembly 8 may simply comprise the jack 10.

In use, whenever the LEDs 94 generate light indicative of some function, e.g., when a circuit including the connector assembly 8 is completed or disrupted, when data is being transmitted or when an error in data transmission occurs, the light thus generated will pass through the light transmitting sections 98 of the light pipe element 96 to the front face 42 of the outer housing part 28 of the jack 10 and will be visible. Also, the signals transmitted from a mating plug to the printed circuit board on which the connector assembly 8 is mounted through the connector assembly 8 will be processed or acted upon by the toroids 90 to obtain the desired benefit thereof, e.g., filtering.

In accordance with the invention, the connector assembly 8 may be constructed with the printed circuit board, optionally having one or more electrical signal processing components mounted thereon, but without the visual indicator, i.e., the LEDs 94. In this case, the LEDs 94 would not be installed on the printed circuit board 82 and the light pipe element 96 would not be inserted into the outer housing part 28. Also, the outer housing part 28 would be constructed without cavities 38, channels 48 and apertures 86.

It is recognized that the placement of LEDs 94 on the same circuit board 82 as the toroids 90 may require electrical isolation on the printed circuit board in view of the electrical noise generated by the LEDs 94.

This issue is avoided in another embodiment of a jack of a connector assembly in accordance with the invention shown in FIG. 17. In FIG. 17, the jack is designated 108 and the same elements of jack 108 as in jack 10 are designated by the same reference numerals with the addition of a prime notation. In this embodiment, instead of mounting LEDs 94 directly on the printed circuit board 82 and transmitting light from the LEDs 94 through the light transmitting sections 98 of the light pipe element 96, LEDs 110 are arranged adjacent or slightly recessed inward from the front face 42 of the outer housing part 28 and leads 112 are provided which extend from the LEDs 110 through the channels 48 in the outer housing part 28 to the printed circuit board 82 at the rear of the jack 10. Preferably, the LEDs 110 are flush with the front face of the jack 10. In this case, if so desired, the outer housing part 28 could be constructed without recesses 40 and apertures 54 since the light pipe element is present and the size of channels 48 may be adjusted to accommodate the leads 112 with minimum clearance. Thus, it should be appreciated that LEDs may be arranged anywhere between the printed circuit board 82 and the front face of the jack 10 and electrical leads and/or a light pipe element provided, if necessary, to effect the transmission of light from the LEDs to the front of the jack.

Although the jack 10 shown in the drawings includes eight contact members 22, the outer housing part 28 and inner housing part 30 may be constructed to receive any number of contact members.

Another possible embodiment of a connector assembly which differs from that illustrated is a through-hole mountable connector assembly. In such a through-hole mountable connector assembly, the outer housing part would be substantially the same as that described above, the printed circuit board component would include the printed circuit board described above and downwardly oriented terminal portions instead of the insert assembly and the inner housing part would preferably include a lower wall at the rear for guiding the terminal portions. In this case, the printed circuit board could include the LEDs mounted thereon and a light pipe element arranged in the outer housing part or LEDs arranged adjacent the front face of the jack and conductor wires extending from the LEDs rearward through the outer housing part to the printed circuit board.

The LED's

In the following, the patent claims will be given, and the various details of the invention can show variation within the scope of the inventive idea defined in the claims and differ even to a considerable extent from the details stated above by way of example only. As such, the examples provided above are not meant to be exclusive and many other variations of the present invention would be obvious to those skilled in the art, and are contemplated to be within the scope of the appended claims.

We claim:

1. A surface mountable connector assembly, comprising:

a jack defining a plug-receiving receptacle;

said jack comprising
   a printed circuit board component including a printed circuit board,
   a first set of contacts each including a contact portion arranged in said receptacle and a board portion connected to said printed circuit board, and
   a second set of contacts each including a terminal portion structured and arranged to be in surface connection with a planar surface of a substrate and a board portion connected to said printed circuit board, said printed circuit board including a wiring pattern for electrically coupling said first and second sets of contacts;
   an outer housing part and an inner housing part arranged in said outer housing part, wherein said inner housing part is generally L-shaped including a front, horizontal portion, a vertical wall extending upward from a rear edge of and perpendicular to said front portion, and a pair of opposed projections extending rearward from the lower lateral sides of said vertical wall and defining an open space therebetween and
   wherein said printed circuit board is situated at least partially in said space between said projections such that said projections extend laterally along either lateral side of said vertical wall and wherein said printed circuit board has a plurality of throughholes arranged so that when said printed circuit board is situated between said projections said board portion of each of said first set of contacts extends through a corresponding one of said throughholes in said printed circuit board.

2. A connector assembly, comprising:

a jack defining a plug-receiving receptacle, said jack comprising
   a printed circuit board component including a printed circuit board,
   a first set of contacts each including a contact portion arranged in said receptacle and a board portion connected to said printed circuit board, and
   a second set of contacts each including a terminal portion connected to a substrate and a board portion connected to said printed circuit board, said printed circuit board including a wiring pattern for electrically coupling said first and second sets of contacts;
   an outer housing part and an inner housing part arranged in said outer housing part;
   wherein said inner housing part is generally L-shaped including a front, horizontal portion, a vertical wall extending from a rear edge of and perpendicular to said front portion, and a pair of opposed projections extending rearward at lateral sides of said vertical wall and defining an open space therebetween, and wherein said front portion includes first guide channels formed at a front edge, slots formed at a rear adjacent said vertical wall from a lower surface of said front portion to an upper surface of said front portion and second guide channels formed on said lower surface, each of said second guide channels extending between a respective one of said first channels and a respective one of said slots, each of said contacts of said first set of contacts being arranged in a respective set of one of said first guide channels, one of said second guide channels and one of said slots.

3. A connector assembly, comprising:

a jack defining a plug-receiving receptacle, said jack comprising a printed circuit board component including a printed circuit board, a first set of contacts each including a contact portion arranged in said receptacle and a board portion connected to said printed circuit board, and a second set of contacts each including a terminal portion adapted for mounting to a substrate and a board portion connected to said printed circuit board, said printed circuit board including a wiring pattern for electrically coupling said first and second sets of contacts, an outer housing part an inner housing part arranged in said outer housing part, wherein said inner housing part is generally L-shaped including a front, horizontal portion, a vertical wall extending from a rear edge of and perpendicular to said front portion, and a pair of opposed projections extending rearward at lateral sides of said vertical wall and defining an open space therebetween, wherein said vertical wall includes guide channels formed at an upper edge, each of said contacts of said first set of contacts being arranged in a respective one of said guide channels, and wherein said printed circuit board is situated at least partially in said space between said projections such that said projections extend laterally along either lateral side of said vertical wall and wherein said printed circuit board has a plurality of throughholes arranged so that when said printed circuit board is situated between said projections said board portion of each of said first set of contacts extends through a corresponding one of said throughholes in said printed circuit board.

4. A surface-mountable connector assembly, comprising:

a jack defining a plug-receiving receptacle, said jack comprising a printed circuit board component including a printed circuit board, a first set of contacts each including a contact portion arranged in said receptacle and a board portion connected to said printed circuit board, and a second set of contacts each including a terminal portion adapted for mounting to a planar surface of a substrate and a board portion connected to said printed circuit board, said printed circuit board including a wiring pattern for electrically coupling said first and second sets of contacts;

wherein said printed circuit board component further comprises an insert assembly connected to said printed circuit board, said insert assembly including a housing and said second set of contacts arranged in connection with said housing whereby said terminal portions are co-planar with one another prior to the connection of said insert assembly to said printed circuit board; and wherein said contacts of said second set of contacts each include said terminal portion extending from one side of said housing, a U-shaped portion extending from an opposed side of said housing, said board portion being arranged adjacent said U-shaped portion, and a straight portion passing through said housing.

5. A surface mountable connector assembly, comprising:

a jack defining a plug-receiving receptacle;

said jack comprising a printed circuit board component including a printed circuit board, a first set of contacts each including a contact portion arranged in said receptacle and a board portion connected to said printed circuit board, and a second set of contacts each including a terminal portion structured and arranged to be in surface connection with a planar surface of a substrate and a board portion connected to said printed circuit board, said printed circuit board including a wiring pattern for electrically coupling said first and second sets of contacts; and light generating means mounted to a front face of said printed circuit board for providing light visible from a front of said jack.

6. The connector assembly of claim 5, wherein said light generating means are arranged in connection with said printed circuit board.

7. The connector assembly of claim 6, wherein said light generating means comprises at least one LED, said wiring pattern in said printed circuit board also being arranged to provide at least a portion of an electrical path between said at least one LED and at least one of said contacts in said second set of contacts.

8. The connector assembly of claim 7, wherein said at least one LED is arranged adjacent a front face of said jack, said light generating means further comprising electrical leads extending from said at least one LED to said printed circuit board.

9. The connector assembly of claim 6, wherein said light generating means are arranged proximate said printed circuit board.

10. A connector assembly, comprising:

a jack defining a plug-receiving receptacle;

said jack comprising a printed circuit board component including a printed circuit board, a first set of contacts each including a contact portion arranged in said receptacle and a board portion connected to said printed circuit board, and a second set of contacts each including a terminal portion connected to a substrate and a board portion connected to said printed circuit board, said printed circuit board including a wiring pattern for electrically coupling said first and second sets of contacts;

light generating means for providing light visible from a front of said jack, wherein said light generating means are arranged in connection with said printed circuit board, wherein said light generating means are arranged proximate said printed circuit board; and a light pipe element having at least one light transmitting section arranged to be visible from the front of said jack and in a path of said light generating means such that light generated by said light generating means is transmitted through said at least one light transmitting section to the front of said jack.

11. The connector assembly of claim 10, wherein said light generating means comprises at least one LED arranged in alignment with a respective one of said a t least one light transmitting section of said light pipe element, said wiring pattern in said printed circuit board also being arranged to electrically couple said at least one LED to at least one of said contacts in said second set of contacts.

12. The connector assembly of claim 10, wherein said jack comprises an outer housing part and said outer housing part and said light pipe element comprise cooperating fastening means for fastening said light pipe element to said outer housing part.

13. The connector assembly of claim 12, wherein said outer housing part further includes at least one channel extending to a front face of said jack and in which a respective one of said at least one light transmitting section of said light pipe element is situated.

14. A connector assembly, comprising:
   a jack defining a plug-receiving receptacle,
   said jack comprising
      a printed circuit board component including a printed circuit board,
      a first set of contacts each including a contact portion arranged in said receptacle and a board portion connected to said printed circuit board,
      a second set of contacts each including a terminal portion adapted for connection to a substrate on which said connector assembly is mounted and a board portion connected to said printed circuit board,
      light generating means arranged in connection with said printed circuit board for providing light visible from a front of said jack, said printed circuit board including a wiring pattern for electrically coupling said first set of contacts, said second set of contacts and said light generating means, and
      a light pipe element having at least one light transmitting section arranged to be visible from the front of said jack and in a path of said light generating means such that light generated by said light generating means is transmitted through said at least one light transmitting section to the front of said jack, and
      wherein said light generating means are arranged proximate said printed circuit board.

15. The connector assembly of claim 14, wherein said light generating means comprise at least one LED arranged in alignment with a respective one of said at least one light transmitting section of said light pipe element.

16. The connector assembly of claim 14, wherein said jack comprises an outer housing part and said outer housing part and said light pipe element comprise cooperating fastening means for fastening said light pipe element to said outer housing part.

17. The connector assembly of claim 14, wherein said outer housing part further includes at least one channel extending to a front face of said jack and in which a respective one of said at least one light transmitting section of said light pipe element is situated.

18. A connector assembly, comprising
   a jack defining a plug-receiving receptacle,
   said jack comprising
      a printed circuit board component including a printed circuit board.
      a first set of contacts each including a contact portion arranged in said receptacle and a board portion connected to said printed circuit board,
      a second set of contacts each including a terminal portion adapted for connection to a substrate on which said connector assembly is mounted and a board portion connected to said printed circuit board, and
      light generating means arranged in connection with said printed circuit board for providing light visible from a front of said jack, said printed circuit board including a wiring pattern for electrically coupling said first set of contacts, said second set of contacts and said light generating means
      wherein said terminal portions extend rearwardly and downward from said jack and have a co-planar portion adapted for mounting to a planar surface of the substrate.

19. A connector assembly comprising
   a jack defining a plug-receiving receptacle,
   said jack comprise
      a printed circuit board component including a printed circuit board,
      a first set of contacts each including a contact portion arranged in said receptacle and a board portion connected to said printed circuit board,
      a second set of contacts each including a terminal portion adapted for connection to a substrate on which said connector assembly is mounted and a board portion connected to said printed circuit board, and
      light generating means arranged in connection with said printed circuit board for providing light visible from a front of said jack, said printed circuit board including a wiring pattern for electrically coupling said first set of contacts, said second set of contacts and said light generating means,
      wherein said printed circuit board component further comprises an insert assembly connected to said printed circuit board, said insert assembly including a housing and said second set of contacts arranged in connection with said housing whereby said terminal portions are co-planar with one another prior to the connection of said insert assembly to said printed circuit board.

* * * * *